(12) United States Patent
Hsu

(10) Patent No.: US 9,508,447 B2
(45) Date of Patent: Nov. 29, 2016

(54) NON-VOLATILE MEMORY

(71) Applicant: eMemory Technology Inc., Hsinchu (TW)

(72) Inventor: Te-Hsun Hsu, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 14/842,857

(22) Filed: Sep. 2, 2015

(65) Prior Publication Data

US 2016/0104711 A1 Apr. 14, 2016

Related U.S. Application Data

(60) Provisional application No. 62/063,410, filed on Oct. 14, 2014.

(51) Int. Cl.

| | | |
|---|---|---|
| *G11C 17/18* | (2006.01) | |
| *H01L 27/115* | (2006.01) | |
| *H01L 29/78* | (2006.01) | |
| *G11C 16/14* | (2006.01) | |
| *G11C 16/04* | (2006.01) | |
| *G11C 17/16* | (2006.01) | |
| *H01L 29/10* | (2006.01) | |
| *H01L 23/525* | (2006.01) | |
| *H01L 27/108* | (2006.01) | |
| *H01L 27/11* | (2006.01) | |
| *H01L 27/112* | (2006.01) | |
| *H01L 29/06* | (2006.01) | |
| *H01L 29/861* | (2006.01) | |
| *H01L 29/868* | (2006.01) | |
| *G11C 29/00* | (2006.01) | |

(52) U.S. Cl.
CPC ........... *G11C 17/18* (2013.01); *G11C 16/0408* (2013.01); *G11C 16/14* (2013.01); *G11C 17/16* (2013.01); *H01L 23/5256* (2013.01); *H01L 27/10897* (2013.01); *H01L 27/1116* (2013.01); *H01L 27/1156* (2013.01); *H01L 27/11206* (2013.01); *H01L 27/11524* (2013.01); *H01L 29/0649* (2013.01); *H01L 29/1033* (2013.01); *H01L 29/78* (2013.01); *H01L 29/868* (2013.01); *H01L 29/8611* (2013.01); *G11C 29/785* (2013.01); *H01L 2924/0002* (2013.01)

(58) Field of Classification Search
CPC ............ H01L 29/788; G11C 16/0483; G11C 16/0441; G11C 16/00; G11C 16/04; G11C 16/0408; G11C 16/0416; G11C 16/0433; G11C 16/0425; G11C 16/0458; G11C 16/10
See application file for complete search history.

(56) References Cited

U.S. PATENT DOCUMENTS

| | | | | |
|---|---|---|---|---|
| 6,044,017 | A * | 3/2000 | Lee | G11C 16/0483 365/185.11 |
| 6,628,550 | B1 * | 9/2003 | Hung | H01L 27/115 257/E21.682 |
| 7,326,994 | B2 | 2/2008 | Hsu et al. | |
| 2004/0130950 | A1 * | 7/2004 | Lee | G11C 16/0408 365/185.18 |

(Continued)

*Primary Examiner* — Allen Parker
*Assistant Examiner* — Gustavo Ramallo
(74) *Attorney, Agent, or Firm* — Jianq Chyun IP Office

(57) ABSTRACT

A non-volatile memory including a substrate, a floating gate transistor, a select transistor and a stress-releasing transistor. The floating gate transistor, the select transistor and the stress-releasing transistor are disposed on the substrate and coupled in series with each other. The stress-releasing transistor is located between the floating gate transistor and the select transistor.

14 Claims, 3 Drawing Sheets

(56) References Cited

U.S. PATENT DOCUMENTS

| | | | | |
|---|---|---|---|---|
| 2007/0097743 A1* | 5/2007 | Fang | G11C 16/0416 | 365/185.05 |
| 2007/0243680 A1* | 10/2007 | Harari | G11C 16/0483 | 438/257 |
| 2009/0159946 A1* | 6/2009 | Huang | G11C 16/0441 | 257/296 |

* cited by examiner

NON-VOLATILE MEMORY

CROSS-REFERENCE TO RELATED APPLICATION

This application claims the priority benefits of U.S. provisional application Ser. No. 62/063,410, filed on Oct. 14, 2014. The entirety of the above-mentioned patent application is hereby incorporated by reference herein and made a part of this specification.

BACKGROUND OF THE INVENTION

Field of the Invention

The invention relates to a memory, and particularly relates to a non-volatile memory.

Description of Related Art

When semiconductor enters a deep sub-micron manufacturing process, a device size is gradually decreased, and in view of a memory device, it represents that a size of memory cell becomes smaller and smaller. On the other hand, along with increase of data required to be processed or stored by information electronic products, a memory capacity required in these information electronic products also becomes greater and greater. Regarding the situation that the device size becomes smaller and the memory capacity is required to be increased, to manufacture a memory device with a small size, a high integration degree and good quality becomes a target of effort in the industry.

Since a non-volatile memory device has an advantage that data stored therein is not disappeared after power-off, the non-volatile memory device has been widely used in personal computers and electronic equipment.

A conventional non-volatile memory is composed of a select transistor and a floating gate transistor. Since only one layer of polysilicon is required to be formed, the manufacturing process of such non-volatile memory can be integrated with a manufacturing process of a complementary metal oxide semiconductor transistor, so as to decrease the manufacturing cost.

However, in the conventional non-volatile memory, an input/output (I/O) device is generally adopted to serve as the select transistor, so that the non-volatile memory cannot be operated in a low power and high speed manner.

Moreover, if a core device is adopted to serve as the select transistor in order to achieve the lower power and high speed operation, during a program operation or an erase operation of the non-volatile memory, the select transistor bears an excessive stress, which may cause a problem of oxide breakdown.

SUMMARY OF THE INVENTION

The invention is directed to a non-volatile memory, which effectively decreases a stress on a select transistor.

The invention provides a non-volatile memory including a substrate, a floating gate transistor, a select transistor and a stress-releasing transistor. The floating gate transistor, the select transistor and the stress-releasing transistor are disposed on the substrate and coupled in series with each other. The stress-releasing transistor is located between the floating gate transistor and the select transistor.

According to an embodiment of the invention, in the non-volatile memory, the floating gate transistor, the select transistor and the stress-releasing transistor are, for example, coupled in series by sharing a doped region.

According to an embodiment of the invention, in the non-volatile memory, the floating gate transistor includes a floating gate, a first doped region, a second doped region and a first dielectric layer. The floating gate is disposed on the substrate. The first doped region and the second doped region are respectively disposed in the substrate at two sides of the floating gate. The first dielectric layer is disposed between the floating gate and the substrate. The select transistor includes a select gate, a third doped region, a fourth doped region and a second dielectric layer. The select gate is disposed on the substrate. The third doped region and the fourth doped region are respectively disposed in the substrate at two sides of the select gate. The second dielectric layer is disposed between the select gate and the substrate. The stress-releasing transistor includes a stress-releasing gate, the second doped region, the third doped region and a third dielectric layer. The stress-releasing gate is disposed on the substrate. The second doped region is located between the floating gate and the stress-releasing gate, and the third doped region is located between the select gate and the stress-releasing gate. The third dielectric layer is disposed between the stress-releasing gate and the substrate.

According to an embodiment of the invention, in the non-volatile memory, a channel length under the stress-releasing gate is, for example, smaller than a minimum channel length of a design rule of an input/output (I/O) device.

According to an embodiment of the invention, in the non-volatile memory, a thickness of the first dielectric layer is, for example, greater than a thickness of the second dielectric layer.

According to an embodiment of the invention, in the non-volatile memory, a thickness of the third dielectric layer is, for example, greater than a thickness of the second dielectric layer.

According to an embodiment of the invention, in the non-volatile memory, the second doped region and the third doped region are, for example, floating doped regions.

According to an embodiment of the invention, in the non-volatile memory, the first doped region to the fourth doped region are, for example, of a same conductive type.

According to an embodiment of the invention, the non-volatile memory further includes at least one first well region disposed in the substrate. The first doped region to the fourth doped region are located in the first well region.

According to an embodiment of the invention, in the non-volatile memory, a conductive type of the first doped region to the fourth doped region is, for example, different to a conductive type of the first well region.

According to an embodiment of the invention, the non-volatile memory further includes a first capacitor and a second capacitor. The first capacitor, the second capacitor and the floating gate transistor are disposed in separation and are coupled to each other.

According to an embodiment of the invention, in the non-volatile memory, the first capacitor, the second capacitor and the floating gate transistor are, for example, coupled by sharing the floating gate.

According to an embodiment of the invention, in the non-volatile memory, the first capacitor includes the floating gate, at least one fifth doped region, and a fourth dielectric layer. The fifth doped region is disposed in the substrate at two sides of the floating gate. The fourth dielectric layer is disposed between the floating gate and the substrate. The second capacitor includes the floating gate, at least one sixth doped region, and a fifth dielectric layer. The sixth doped region is disposed in the substrate at the two sides of the floating gate. The fifth dielectric layer is disposed between the floating gate and the substrate.

According to an embodiment of the invention, in the non-volatile memory, a thickness of the fourth dielectric layer and a thickness of the fifth dielectric layer are, for example, respectively greater than a thickness of the second dielectric layer.

According to an embodiment of the invention, the non-volatile memory further includes a second well region and a third well region. The second well region is disposed in the substrate. The fifth doped region is located in the second well region. The third well region is disposed in the substrate. The sixth doped region is located in the third well region.

According to an embodiment of the invention, in the non-volatile memory, when two adjacent well regions of the first well region, the second well region and the third well region are of a first conductive type, the two adjacent well regions of the first conductive type of the first well region, the second well region and the third well region are, for example, disposed in separation.

According to an embodiment of the invention, the non-volatile memory further includes a fourth well region of a second conductive type between the two adjacent well regions of the first conductive type of the first well region, the second well region and the third well region, wherein the second conductive type is different to the first conductive type.

According to an embodiment of the invention, in the non-volatile memory, when two adjacent well regions of the first well region, the second well region and the third well region are of different conductive types, the two adjacent well regions of the different conductive types of the first well region, the second well region and the third well region are, for example, disposed in separation or connected to each other.

According to an embodiment of the invention, in the non-volatile memory, an area of the floating gate in the second capacitor is, for example, grater than an area of the floating gate in the floating gate transistor and an area of the floating gate in the first capacitor.

According to an embodiment of the invention, in the non-volatile memory, an area of the floating gate in the floating gate transistor is, for example, greater than an area of the floating gate in the first capacitor.

According to the above descriptions, in the non-volatile memory of the invention, since the stress-releasing transistor is located between the floating gate transistor and the select transistor, when the program operation and the erase operation are performed to the non-volatile memory, a stress on the select transistor is decreased. In this way, even if a core device is taken as the select transistor to achieve a low power and high speed operation, oxide breakdown of the select transistor is avoided.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
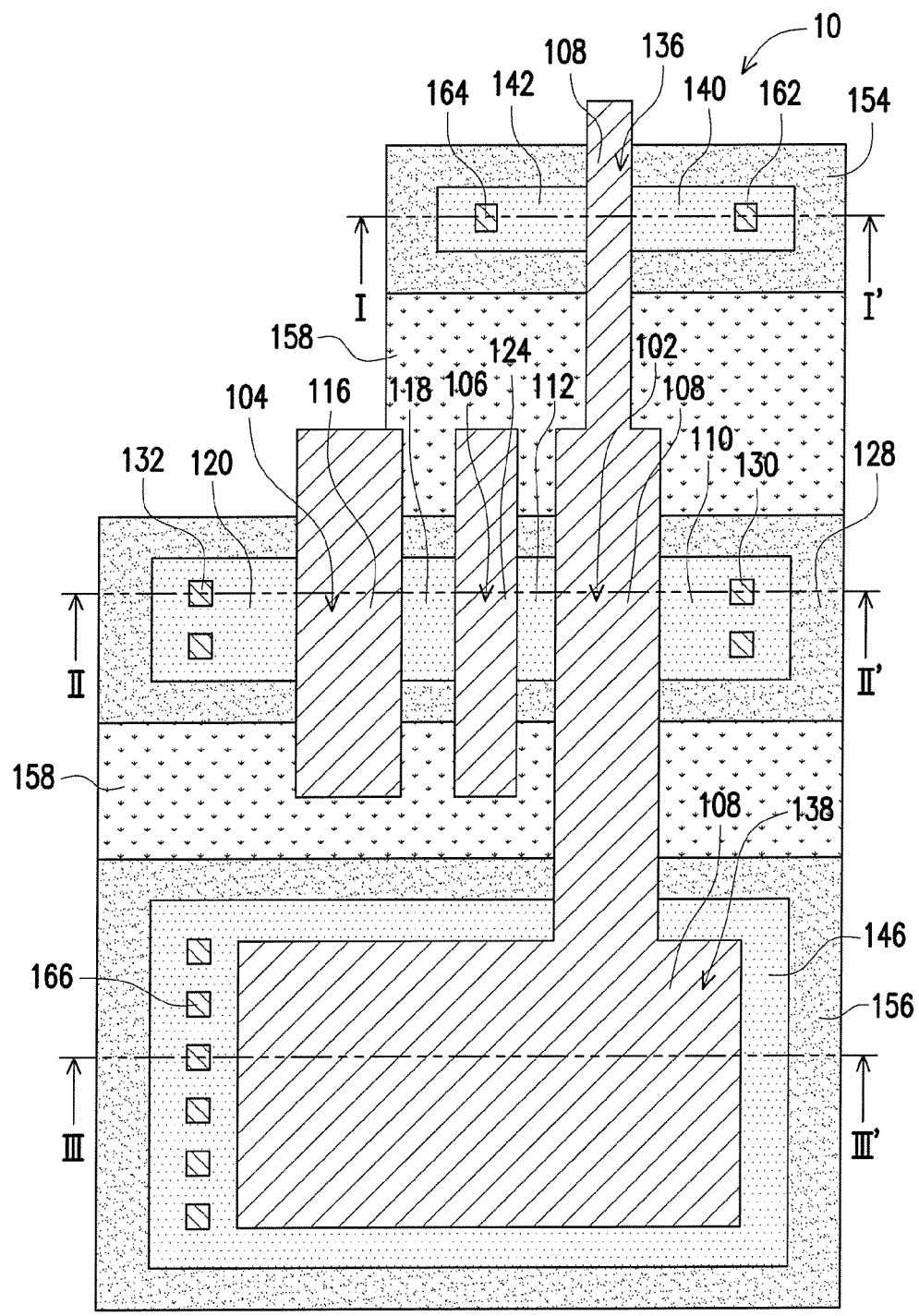
FIG. 1 is a top view of a non-volatile memory according to an embodiment of the invention.
Figure 2A:
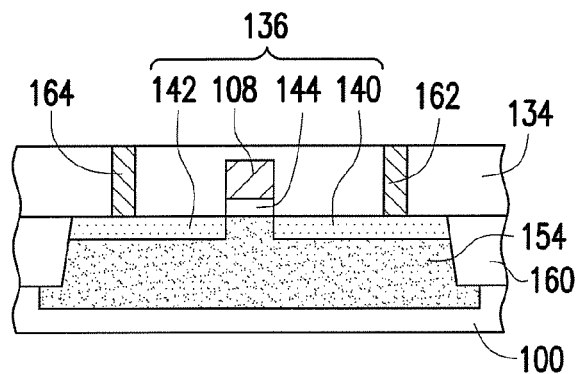
FIG. 2A is a cross-sectional view of FIG. 1 along a section line I-I'.
Figure 2B:
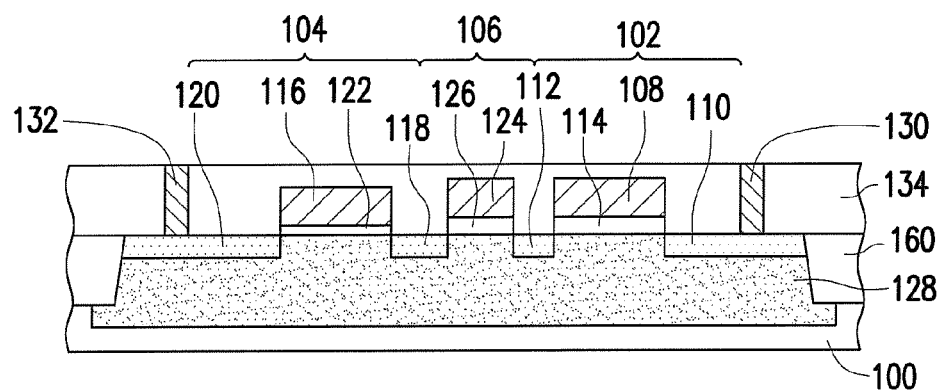
FIG. 2B is a cross-sectional view of FIG. 1 along a section line II-II'.
Figure 2C:
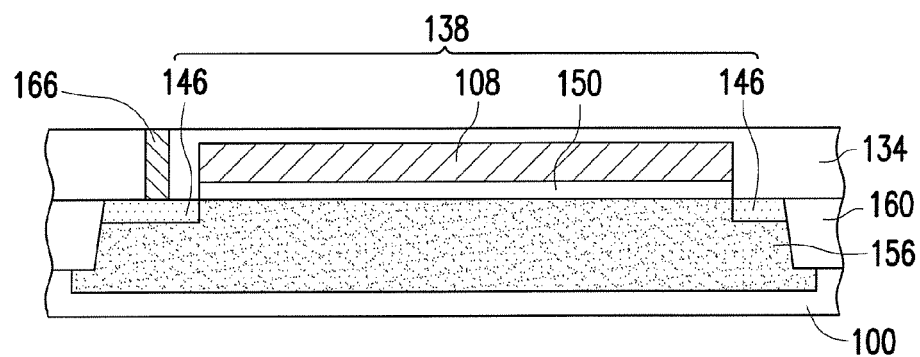
FIG. 2C is a cross-sectional view of FIG. 1 along a section line III-III'.

FIG. 1 is a top view of a non-volatile memory according to an embodiment of the invention. In FIG. 1, in order to clearly describe the structure of the non-volatile memory, an isolation structure and dielectric layers are omitted. FIG. 2A is a cross-sectional view of FIG. 1 along a section line I-I'. FIG. 2B is a cross-sectional view of FIG. 1 along a section line II-II'. FIG. 2C is a cross-sectional view of FIG. 1 along a section line III-III'.

Referring to FIG. 1 and FIG. 2B, the non-volatile memory 10 includes a substrate 100, a floating gate transistor 102, a select transistor 104 and a stress-releasing transistor 106. The floating gate transistor 102, the select transistor 104 and the stress-releasing transistor 106 are disposed on the substrate 100 and are coupled in series with each other. The stress-releasing transistor 106 is located between the floating gate transistor 102 and the select transistor 104, so that a stress on the select transistor 104 during the operation of the non-volatile memory 10 can be decreased through the stress-releasing transistor 106. The floating gate transistor 102, the select transistor 104 and the stress-releasing transistor 106 are, for example, coupled in series by sharing a doped region.

The floating gate transistor 102 includes a floating gate 108, a doped region 110, a doped region 112 and a dielectric layer 114. The floating gate 108 is disposed on the substrate 100. When a program operation is performed, electrons enter the floating gate 108 in the floating gate transistor 102 for storage. A material of the floating gate 108 is, for example, a conductive material such as doped polysilicon, etc., and a method for forming the floating gate 108 is, for example, a chemical vapor deposition method.

The doped region 110 and the doped region 112 are respectively disposed in the substrate 100 at two sides of the floating gate 108. The doped region 110 and the doped region 112 are, for example, of a same conductive type, which can be respectively an N-type doped region or a P-type doped region. A method for forming the doped region 110 and the doped region 112 is, for example, an ion implantation method.

The dielectric layer 114 is disposed between the floating gate 108 and the substrate 100. A material of the dielectric layer 114 is, for example, silicon oxide. A method for forming the dielectric layer 114 is, for example, a thermal oxidation method or the chemical vapor deposition method.

The select transistor 104 includes a select gate 116, a doped region 118, a doped region 120 and a dielectric layer 122. The select gate 116 is disposed on the substrate 100. A material of the select gate 116 is, for example, a conductive material such as doped polysilicon, etc., and a method for forming the select gate 116 is, for example, the chemical vapor deposition method.

The doped region 118 and the doped region 120 are respectively disposed in the substrate 100 at two sides of the select gate 116. The doped region 118 and the doped region 120 are, for example, of a same conductive type, which can be respectively the N-type doped region or the P-type doped region. A method for forming the doped region 118 and the doped region 120 is, for example, the ion implantation method. Moreover, the doped regions, 110, 112, 118 and 120 are, for example, of the same conductive type.

The dielectric layer 122 is disposed between the select gate 116 and the substrate 100. A thickness of the dielectric layer 114 is, for example, greater than a thickness of the dielectric layer 122. A material of the dielectric layer 122 is, for example, silicon oxide. A method for forming the dielectric layer 122 is, for example, the thermal oxidation method or the chemical vapor deposition method.

The stress-releasing transistor 106 includes a stress-releasing gate 124, the doped region 112, the doped region 118 and a dielectric layer 126, and the stress-releasing transistor 106 can be configured to release a part of stress transmitted to the select transistor 104, so as to decrease the stress on the select transistor 104. The stress-releasing gate 124 is disposed on the substrate 100. A channel length under the stress-releasing gate 124 is, for example, smaller than a minimum channel length of a design rule of an input/output (I/O) device, such that a short channel effect is occurred between the doped region 112 and the doped region 118, and a threshold voltage Vt of the stress-releasing transistor 106 can be smaller than a threshold voltage of the general I/O device. In an embodiment, the threshold voltage of the stress-releasing transistor 106 can be 0. A material of the stress-releasing gate 124 is, for example, a conductive material such as doped polysilicon, etc., and a method for forming the stress-releasing gate 124 is, for example, the chemical vapor deposition method.

The doped region 112 is located between the floating gate 108 and the stress-releasing gate 124, such that the stress-releasing transistor 106 and the floating gate transistor 102 can share the doped region 112. Moreover, the doped region 118 is located between the select gate 116 and the stress-releasing gate 124, such that the stress-releasing transistor 106 and the select transistor 104 can share the doped region 118. The doped region 112 and the doped region 118 are, for example, floating doped regions.

The dielectric layer 126 is disposed between the stress-releasing gate 124 and the substrate 100. A thickness of the dielectric layer 126 is, for example, greater than the thickness of the dielectric layer 122. A material of the dielectric layer 126 is, for example, silicon oxide. A method for forming the dielectric layer 126 is, for example, the thermal oxidation method or the chemical vapor deposition method.

The non-volatile memory 10 may further include at least one well region 128 disposed in the substrate 100. The doped regions 110, 112, 118 and 120 are located in the well region 128. The well region 128 can be an N-type well region or a P-type well region. A method for forming the well region 128 is, for example, the ion implantation method. The conductive type of the doped regions 110, 112, 118 and 120 is, for example, different to a conductive type of the well region 128. In this embodiment, the non-volatile memory 10 is described as having one well region 128 as an example. Namely, the floating gate transistor 102, the select transistor 104, and the stress-releasing transistor 106 are located in the same well region 128. However, the invention is not limited thereto. In other embodiments, the well region of a core device and the well region of an input/output device may be manufactured separately. Thus, when the core device is adopted as the select transistor 104 and the input/output device is adopted as the floating gate transistor 102 and the stress-releasing transistor 106, the well region of the select transistor 104 and the well region of the floating gate transistor 102 and the stress releasing transistor 106 may also be different well regions.

The non-volatile memory 10 may further include a contact via 130 and a contact via 132 disposed in the dielectric layer 134. The contact via 130 and the contact via 132 are respectively connected to the doped region 110 and the doped region 120, so as to respectively couple the doped region 110 and the doped region 120 to an external power or an external circuit. A material of the contact via 130 and the contact via 132 is, for example, tungsten, copper or aluminium. A method for forming the contact via 130 and the contact via 132 is, for example, a physical vapor deposition method.

Referring to FIG. 1, FIG. 2A to FIG. 2C, the non-volatile memory 10 may further include a capacitor 136 and a capacitor 138. The capacitor 136, the capacitor 138 and the floating gate transistor 102 are disposed in separation and are coupled to each other. The capacitor 136, the capacitor 138 and the floating gate transistor 102 are, for example, coupled to each other by sharing the floating gate 108. An area of the floating gate 108 in the capacitor 138 is, for example, greater than an area of the floating gate 108 in the floating gate transistor 102 and an area of the floating gate 108 in the capacitor 136. The area of the floating gate 108 in the floating gate transistor 102 is, for example, greater than the area of the floating gate 108 in the capacitor 136.

In the present embodiment, a situation that the capacitor 136 and the capacitor 138 are located at two sides of the floating gate transistor 102 is taken as an example for description, though the invention is not limited thereto, and as long as the capacitor 136, the capacitor 138 and the floating gate transistor 102 are coupled to each other, it is considered to be within a protection scope of the invention. For example, a configuration method that the floating gate transistor 102 and the capacitor 136 are disposed at two sides of the capacitor 138 can also be adopted.

The capacitor 136 includes the floating gate 108, a doped region 140, a doped region 142 and a dielectric layer 144. The floating gate 108 in the capacitor 136 can serve as an erase gate. During an erase operation, electrons can move out from the floating gate 108 in the capacitor 136.

The doped region 140 and the doped region 142 are disposed in the substrate 100 at two sides of the floating gate 108. The doped region 140 and the doped region 142 can be of the same or different conductive types, which can be respectively the N-type doped region or the P-type doped region. A method for forming the doped region 140 and the doped region 142 is, for example, the ion implantation method.

The dielectric layer 144 is disposed between the floating gate 108 and the substrate 100. A thickness of the dielectric layer 144 is, for example, greater than a thickness of the dielectric layer 122. A material of the dielectric layer 144 is, for example, silicon oxide. A method for forming the dielectric layer 144 is, for example, the thermal oxidation method or the chemical vapor deposition method.

The capacitor 138 includes the floating gate 108, a doped region 146, and a dielectric layer 150. The floating gate 108 in the capacitor 138 can serve as a coupling gate. When the non-volatile memory is operated, the floating gate 108 in the capacitor 138 can be used to provide a correct voltage.

The doped region 146 is disposed in the substrate 100 at two sides of the floating gate 108. In this embodiment, the doped region 146 surrounds the floating gate 108 of the capacitor 138, so that the doped region 146 is located at two sides of the floating gate 108. The doped region 146 can be the N-type doped region or the P-type doped region.

The dielectric layer 150 is disposed between the floating gate 108 and the substrate 100. A thickness of the dielectric layer 150 is, for example, greater than the thickness of the dielectric layer 122. A material of the dielectric layer 150 is, for example, silicon oxide. A method for forming the dielectric layer 150 is, for example, the thermal oxidation method or the chemical vapor deposition method.

The non-volatile memory 10 may further include a well region 154 and a well region 156. The well region 154 is disposed in the substrate 100. The doped region 140 and the doped region 142 are located in the well region 154. The well region 156 is disposed in the substrate 100. The doped region 146 is located in the well region 156. The well region 154 and the well region 156 can be respectively an N-type well region or a P-type well region. A method for forming the well region 154 and the well region 156 is, for example, the ion implantation method.

When two adjacent well regions of the well region 128, the well region 154 and the well region 156 are of the first conductive type, the two adjacent well regions of the first conductive type of the well region 128, the well region 154 and the well region 156 are, for example, disposed in separation. Moreover, the non-volatile memory 10 may further include a well region 158 of a second conductive type between the two adjacent well regions of the first conductive type of the well region 128, the well region 154 and the well region 156, wherein the second conductive type is different to the first conductive type. When the two adjacent well regions of the well region 128, the well region 154 and the well region 156 are of different conductive types, the two adjacent well regions of the different conductive types of the well region 128, the well region 154 and the well region 156 are, for example, disposed in separation or connected to each other. In the present embodiment, a situation that the well region 128, the well region 154 and the well region 156 are of the same conductive type is taken as an example for description.

The non-volatile memory 10 may further include an isolation structure 160. The isolation structure 160 can be disposed in the substrate 100 outside the well region 128, the well region 154 and the well region 156. The isolation structure 160 is, for example, a shallow trench isolation structure, and a material of the isolation structure 160 is, for example, silicon oxide.

The non-volatile memory 10 may further include a contact via 162, a contact via 164 and a contact via 166 disposed in the dielectric layer 134. The contact via 162, the contact via 164 and the contact via 166 are respectively connected to the doped region 140, the doped region 142 and the doped region 146, so as to respectively couple the doped region 140, the doped region 142 and the doped region 146 to an external power or an external circuit. A material of the contact via 162, the contact via 164 and the contact via 166 is, for example, tungsten, copper or aluminium. A method for forming the contact via 162, the contact via 164 and the contact via 166 is, for example, the physical vapor deposition method.

Figure 3:
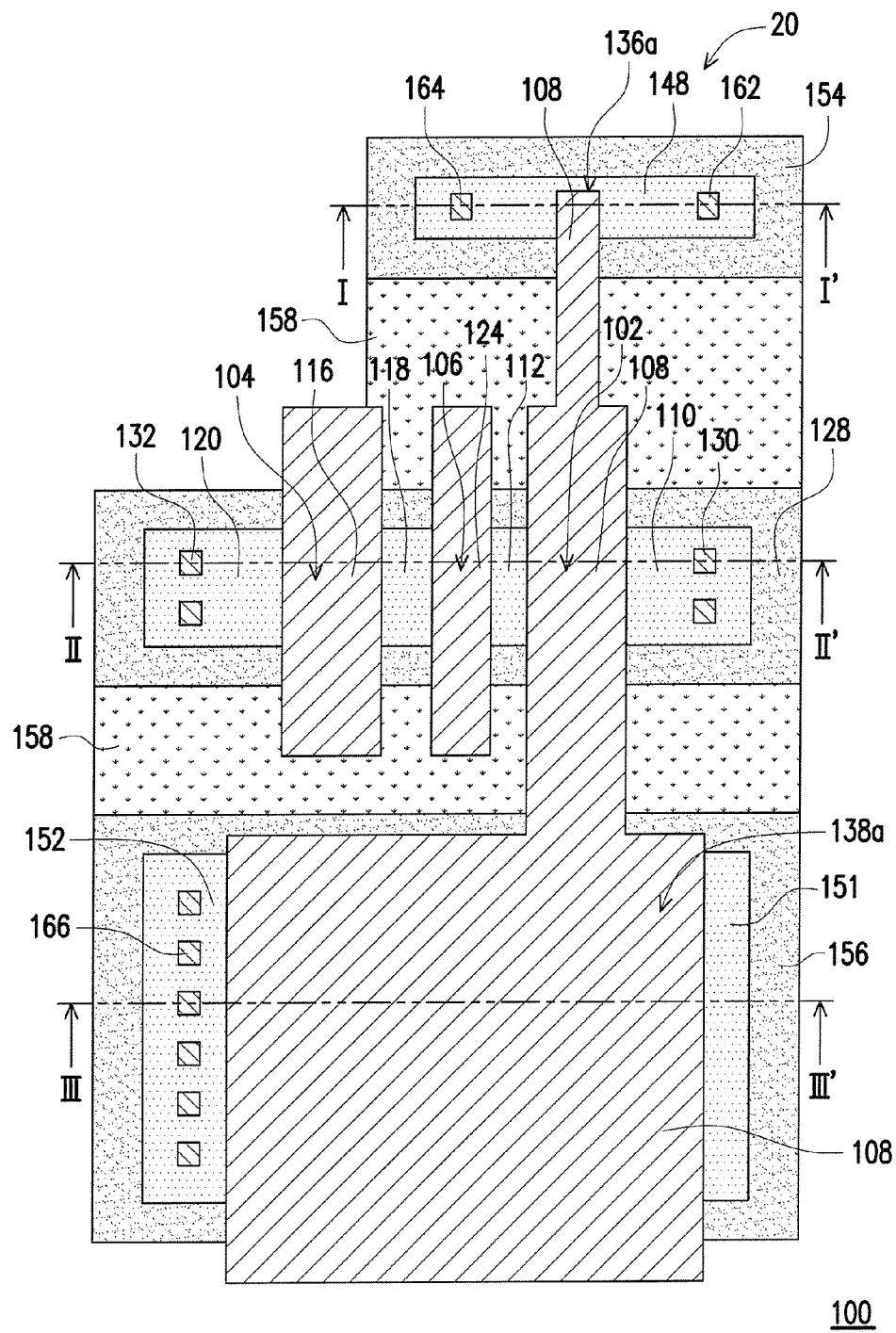
FIG. 3 is a top view of a non-volatile memory according to another embodiment of the invention.

FIG. 3 is a top view of a non-volatile memory according to another embodiment of the invention.

Referring to FIGS. 1 and 3 together, a non-volatile memory 20 of FIG. 3 and the non-volatile memory 10 of FIG. 1 have differences as follows. The capacitor 136 of the non-volatile memory 10 includes two doped regions (140 and 142), while a capacitor 136a of the non-volatile memory 20 only includes one doped region 148 disposed in the substrate 100, and an end of the floating gate 108 of the capacitor 136a is located in the doped region 148. The doped region 148 surrounds the floating gate 108 of the capacitor 136a, so that the doped region 148 is located at two sides of the floating gate 108. In addition, the capacitor 138 of the non-volatile memory 10 includes one doped region 146, while a capacitor 138a of the non-volatile memory 20 includes doped regions 151 and 152. The doped regions 151 and 152 are disposed in the substrate 100 at two sides of the floating gate 108. Like components in the non-volatile memory 20 and the non-volatile memory 10 are represented by like symbols, and the descriptions thereof are thus not repeated in the following.

Based on the above embodiment, it can be known that people having ordinary skills in the art may adjust the number and configurations of the doped regions of the capacitors 136, 138, 136a, and 138a based on the design requirement of the product. For example, the design of the non-volatile memory 10 including the capacitor 136 with two doped regions (140, 142) may be modified into the design as in the non-volatile memory 20 that includes the capacitor 136a with only one doped region (148). Besides, the design of the non-volatile memory 20 including the capacitor 136a with one doped region (148) may be modified into the design as in the non-volatile memory 10 that includes the capacitor 136 with two doped regions (140, 142).

In summary, in the non-volatile memory 10 of the invention, since the stress-releasing transistor 106 is located between the floating gate transistor 102 and the select transistor 104, when the program operation and the erase operation are performed to the non-volatile memory 10, a stress on the select transistor 104 is decreased. In this way, even if a core device is taken as the select transistor 104 to achieve a low power and high speed operation, oxide breakdown of the select transistor 104 is avoided.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A non-volatile memory, comprising:
   a substrate;
   a floating gate transistor, a select transistor and a stress-releasing transistor, disposed on the substrate and coupled in series with each other, wherein the stress-releasing transistor is located between the floating gate transistor and the select transistor, wherein
   the floating gate transistor comprises:
      a floating gate, disposed on the substrate;
      a first doped region and a second doped region, respectively disposed in the substrate at two sides of the floating gate; and
      a first dielectric layer, disposed between the floating gate and the substrate;
   the select transistor comprises:
      a select gate, disposed on the substrate;
      a third doped region and a fourth doped region, respectively disposed in the substrate at two sides of the select gate; and
      a second dielectric layer, disposed between the select gate and the substrate;

the stress-releasing transistor comprises:
  a stress-releasing gate, disposed on the substrate;
  the second doped region and the third doped region, wherein the second doped region is located between the floating gate and the stress-releasing gate, and the third doped region is located between the select gate and the stress-releasing gate; and
  a third dielectric layer, disposed between the stress-releasing gate and the substrate;
at least one first well region, disposed in the substrate, wherein the first doped region to the fourth doped region are located in the at least one first well region;
a first capacitor and a second capacitor, wherein the first capacitor, the second capacitor and the floating gate transistor are disposed in separation and are coupled to each other, wherein
the first capacitor comprises:
  the floating gate;
  at least one fifth doped region, disposed in the substrate at two sides of the floating gate; and
  a fourth dielectric layer, disposed between the floating gate and the substrate,
the second capacitor comprises:
  the floating gate;
  at least one sixth doped region, disposed in the substrate at the two sides of the floating gate; and
  a fifth dielectric layer, disposed between the floating gate and the substrate;
a second well region, disposed in the substrate, wherein the at least one fifth doped region is located in the second well region; and
a third well region, disposed in the substrate, wherein the at least one sixth doped region is located in the third well region.

2. The non-volatile memory as claimed in claim 1, wherein the floating gate transistor, the select transistor and the stress-releasing transistor are coupled in series by sharing a doped region.

3. The non-volatile memory as claimed in claim 1, wherein a thickness of the first dielectric layer is greater than a thickness of the second dielectric layer.

4. The non-volatile memory as claimed in claim 1, wherein a thickness of the third dielectric layer is greater than a thickness of the second dielectric layer.

5. The non-volatile memory as claimed in claim 1, wherein the second doped region and the third doped region are floating doped regions.

6. The non-volatile memory as claimed in claim 1, wherein the first doped region to the fourth doped region are of a same conductive type.

7. The non-volatile memory as claimed in claim 1, wherein a conductive type of the first doped region to the fourth doped region is different to a conductive type of the at least one first well region.

8. The non-volatile memory as claimed in claim 1, wherein the first capacitor, the second capacitor and the floating gate transistor are coupled by sharing the floating gate.

9. The non-volatile memory as claimed in claim 1, wherein a thickness of the fourth dielectric layer and a thickness of the fifth dielectric layer are respectively greater than a thickness of the second dielectric layer.

10. The non-volatile memory as claimed in claim 1, wherein when two adjacent well regions of the at least one first well region, the second well region and the third well region are of a first conductive type, the two adjacent well regions of the first conductive type of the at least one first well region, the second well region and the third well region are disposed in separation.

11. The non-volatile memory as claimed in claim 10, further comprising:
  a fourth well region of a second conductive type between the two adjacent well regions of the first conductive type of the at least one first well region, the second well region and the third well region, wherein the second conductive type is different to the first conductive type.

12. The non-volatile memory as claimed in claim 1, wherein when two adjacent well regions of the at least one first well region, the second well region and the third well region are of different conductive types, the two adjacent well regions of the different conductive types of the at least one first well region, the second well region and the third well region are disposed in separation or connected to each other.

13. The non-volatile memory as claimed in claim 1, wherein an area of the floating gate in the second capacitor is greater than an area of the floating gate in the floating gate transistor and an area of the floating gate in the first capacitor.

14. The non-volatile memory as claimed in claim 1, wherein an area of the floating gate in the floating gate transistor is greater than an area of the floating gate in the first capacitor.

* * * * *